United States Patent [19]

Murakami

[11] Patent Number: 5,499,447

[45] Date of Patent: Mar. 19, 1996

[54] METHOD FOR MANUFACTURING A PRINTED CIRCUIT BOARD HAVING ELECTRODES ON END SURFACE OF SUBSTRATE

[75] Inventor: Tomoo Murakami, Tokyo, Japan

[73] Assignee: NEC Corporation, Tokyo, Japan

[21] Appl. No.: 358,370

[22] Filed: Dec. 19, 1994

[30] Foreign Application Priority Data

Dec. 17, 1993 [JP] Japan ................... 5-344372

[51] Int. Cl.$^6$ ........................... H01K 3/10
[52] U.S. Cl. ................ 29/852; 29/829; 29/846; 174/260; 174/262; 174/265; 228/180.21; 427/97
[58] Field of Search ............... 29/852, 846; 228/180.21; 427/97; 174/260, 262, 265

[56] References Cited

U.S. PATENT DOCUMENTS

| | | | |
|---|---|---|---|
| 4,372,046 | 2/1983 | Suzuki | 29/846 X |
| 4,543,715 | 10/1985 | Iadarola et al. | 427/97 X |
| 4,790,894 | 12/1988 | Homma | 228/180.21 X |
| 4,821,007 | 4/1989 | Fields et al. | 29/846 X |
| 5,140,745 | 8/1992 | McKenzie, Jr. | 427/97 X |

FOREIGN PATENT DOCUMENTS

| | | | |
|---|---|---|---|
| 62-43139 | 2/1987 | Japan . | |
| 62-169439 | 7/1987 | Japan . | |
| 1-290283 | 11/1989 | Japan . | |
| 2-94266 | 4/1990 | Japan . | |
| 3-52291 | 3/1991 | Japan . | |
| 3-106096 | 5/1991 | Japan . | |
| 3-160785 | 7/1991 | Japan | 29/829 |
| 3-187292 | 8/1991 | Japan | 427/97 |
| 3-209795 | 9/1991 | Japan . | |
| 4-71289 | 3/1992 | Japan . | |
| 5-327156 | 12/1993 | Japan . | |

*Primary Examiner*—Carl J. Arbes
*Attorney, Agent, or Firm*—Sughrue, Minn, Zion, Macpeak & Seas

[57] ABSTRACT

The method for manufacturing a printed circuit board having an electrode on an end surface of a substrate has the steps of forming a hole at a predetermined position of a laminate board whose two surfaces are copper plated, filling in the hole with copper paste, forming a circuit pattern such that a copper foil portion remains only in one half of the hole, and etching an exposed region of the substrate. No mechanical process is used in the formation of the end face through-hole so that it is free from the development of burrs in or peeling off of a conductive layer.

8 Claims, 6 Drawing Sheets

METHOD FOR MANUFACTURING A PRINTED CIRCUIT BOARD HAVING ELECTRODES ON END SURFACE OF SUBSTRATE

BACKGROUND OF THE INVENTION (1) Field of the Invention

The present invention relates to a method for manufacturing a printed circuit board, and more particularly to a method for manufacturing a printed circuit board having electrodes on an end face of a substrate.

(2) Description of the Related Art

As a conventional method for manufacturing a printed circuit board, a technology well known (hereinafter referred to as a first prior art) is one in which a substrate having through-holes formed therein is cut at a plane passing through the through-holes by means of metal press or router cutting processes whereby the end face through-holes are formed with each of the internal portions of the through-holes being exposed in a semi-circular form at an outer end face of the printed circuit board.

Figure 1A:
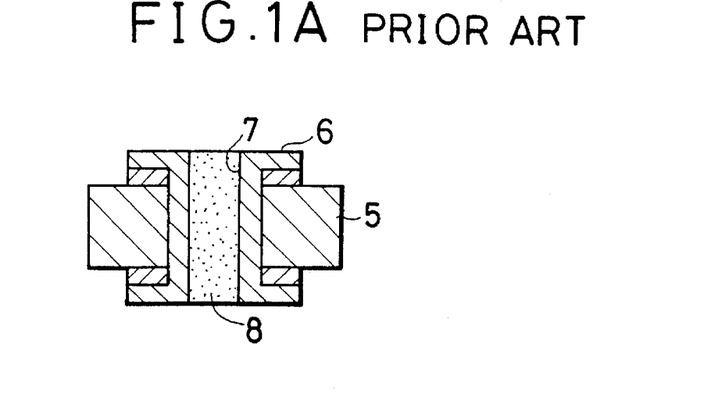
FIGS. 1A and 1B are diagrams of a portion of a printed circuit board used for explaining a conventional method for manufacturing the printed circuit board, FIG. 1A being a sectional view taken along a line 1A in FIG. 1B, and FIG. 1B being a plan view thereof.
Figure 1B:
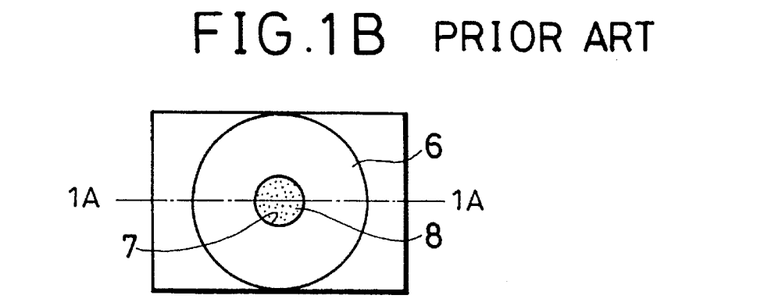
Figure 2A:
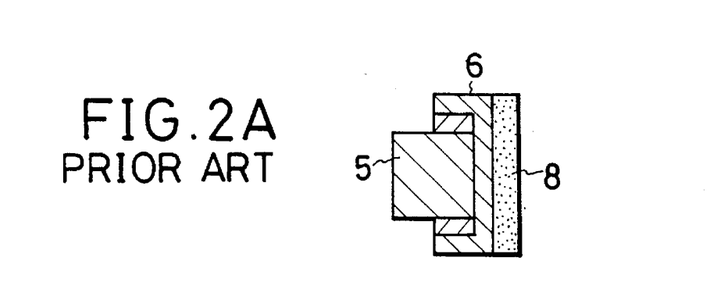
FIGS. 2A and 2B are diagrams of a portion of a printed circuit board used for explaining a conventional method for manufacturing the printed circuit board, FIG. 2A being a sectional view taken along a line 2A—2A in FIG. 2B, end FIG. 2B being a plan view thereof.
Figure 2B:
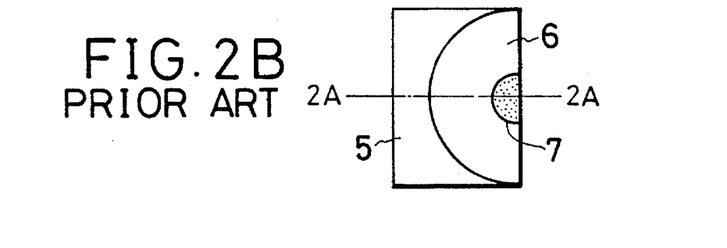
Figure 3A:
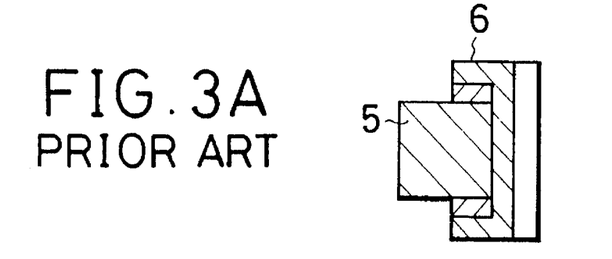
FIGS. 3A and 3B are diagrams of a portion of a printed circuit board used for explaining a conventional method for manufacturing the printed circuit board, FIG. 3A being a sectional view taken along a line 3A—3A in FIG. 3B and FIG. 3B being a plan view thereof.
Figure 3B:
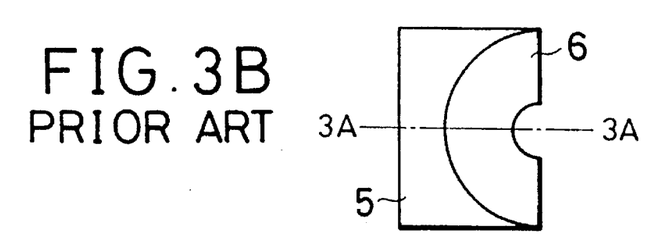

Another technology (hereinafter referred to as a second prior art) which is an improvement of the first prior art has been disclosed in Japanese Patent Application Kokai Publication Hei 3-187292. FIGS. 1A and 1B are diagrams for use in explaining the method disclosed in that publication. FIG. 1A is a sectional view taken along a line 1A—1A in FIG. 1B. As shown therein, first, a substrate 5 prepared by a known method is copper plated 6 and resin 8 is filled in a through-hole 7 therein. Then, as seen in FIGS. 2A and 2B (FIG. 2A being a sectional view taken along a line 2A—2A in FIG. 2B), the substrate 5 is cut into two halves in a plane passing through the through-hole 7 by using such means as metal press or router processes. Thereafter, as seen in FIGS. 3A and 3B (FIG. 3A being a sectional view taken along a line 3A–3A in FIG. 8B), the resin 8 present in the end face through-hole 7 is removed using chemicals. According to this method, since the resin 8 exists in the through-hole 7 during the cutting process, it is possible to prevent the plated layer 6 from being damaged or peeled off.

However, the conventional methods for manufacturing the printed circuit board explained above suffer from the problems as follows:

(1) During the cutting process with the first prior art technology where use is made of the metal press, the plated layer on the inner wall of the through-hole is pulled down vertically along the through-hole so that the plated layer develops burrs pointing downward from the bottom of the end face through-hole and also there are possibilities for the land in the direction underneath the press to be damaged and for the plated layer to be peeled off.

(2) Also, during the cutting process with the first prior art technology where use is made of the router process, the plated layer on an inner wall of the through-hole is pulled laterally along the through-hole so that the plated layer develops burrs from the side of the end face through-hole and also there are possibilities for the plated layer to be peeled off from the inner well of the through-hole.

Figure 4:
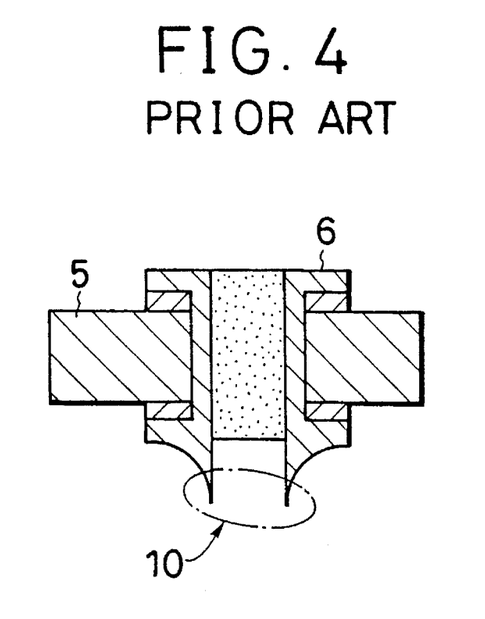
FIG. 4 is a sectional view of a conventional printed circuit board.

(3) In the method for manufacturing a printed circuit board disclosed in Japanese Patent Application Kokai Publication No. Hei 3-187292, phenomena such as the damaging of or the peeling-off from the through-hole do not occur because the cutting process is carried out with the inside of the through-hole being filled with the resin. However, as seen in FIGS. 2A and 2B, because the end portion of the end face through-hole is subjected to the cutting process, the burrs do develop in the same way as in the first prior art technology. FIG. 4 shows the state in which the burrs 10 develop when the metal press is used for the cutting.

SUMMARY OF THE INVENTION

An object of the present invention is, therefore, to overcome the problems existing in the prior art and to provide an improved method for manufacturing a printed circuit board which is free from the development of burrs in a conductive layer or peeling off thereof.

According to an aspect of the invention, there is provided a method for manufacturing a printed circuit board having an electrode on an end surface of a substrate, the method comprising the steps of:

forming a hole at a predetermined position of a laminate board whose two surfaces are copper plated;

filling in the hole with copper paste;

forming a circuit pattern such that a copper foil portion remains only in one half of the hole; and etching away an exposed region of the substrate.

The method may further comprise a step of copper plating the copper foil portion and the copper paste portion so that these portions are integrated.

In the method for manufacturing a printed circuit board according to the invention, the end face of the end face through-hole is formed by an etching process so that it is possible to obtain an end face through-hole which is free from the development of burrs in and the peeling off of a conductor. Also, since the copper foil portion and the copper paste portion are integrated by copper plating, it is possible to enhance the adhering property of the copper paste.

The method for manufacturing a printed circuit board according to the invention produces the following advantageous effects:

(1) Because no mechanical process is used in the formation of the end face through-hole, it is possible to obtain the end face through-hole which is free from the development of burrs in or peeling off of a conductive layer.

(2) Because the conductor (formed as a thick conductive layer) formed in a cylindrical shape is present at the end face unlike in the conventional configuration of the through-hole in which the inside of the hole is exposed in a semi-cylindrical shape at the end face of the printed circuit board, it is possible to obtain the side face electrodes in which the reliability is ensured.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 15A and 15B are diagrams of a portion of a printed circuit board used for explaining further the second embodiment of the method for manufacturing the printed circuit board according to the invention. FIG. 15A being a plan view thereof and FIG. 15B being a sectional view thereof.

PREFERRED EMBODIMENTS OF THE INVENTION

Now, preferred embodiments of the invention are explained with reference to the drawings.

FIGS. 5A and 5B–FIGS. 9A and 9B are diagrams used for explaining a first embodiment of the method for manufacturing a printed circuit board according to the invention, all of Figures A being plan views thereof and all of Figures B being sectional views thereof.

Figure 5A:
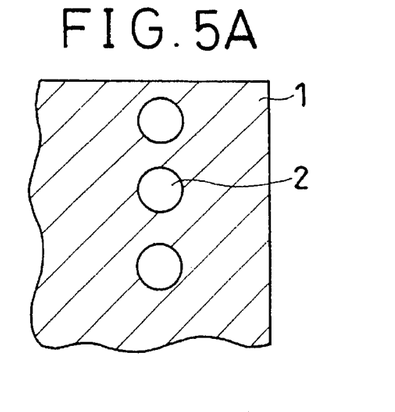
FIGS. 5A end 5B are diagrams of a portion of a printed circuit board used for explaining a first embodiment of a method for manufacturing the printed circuit board according to the invention, FIG. 5A being a plan view thereof and FIG. 5B being a sectional view thereof.
Figure 5B:
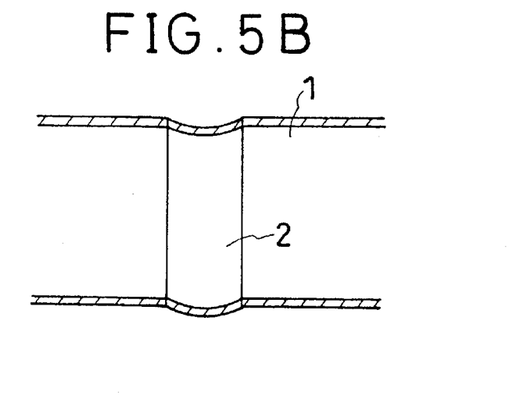

As shown in FIGS. 5A and 5B, a hole 2 is made at a predetermined location, by using a tool such as a drill, in a laminate 1 whose two surfaces are copper plated. The copper plated laminate 1 is not limited to being only of this form, and it may also be a multi-layer laminate board. Also, the substrate material is not limited to any particular material as it may employ an epoxy material (resin having an epoxy radical impregnated into glass cloth), a polyimide material (polymerized resin having a polyimide radical impregnated into glass cloth), etc. In this embodiment, where the epoxy material is used, the thickness of the board is 0.8 mm and the diameter of the drill is 0.50 mm. However, there are no limitations to the substrate material, the thickness of the board and the diameter of the drill.

Figure 6A:
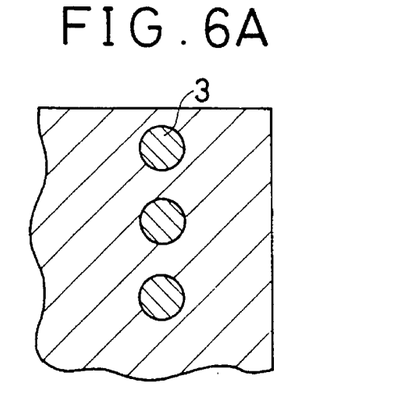
FIGS. 6A and 6B are diagrams of a portion of a printed circuit board used for explaining further the first embodiment of the method for manufacturing the printed circuit board according to the invention, FIG. 6A being a plan view thereof and FIG. 6B being a sectional view thereof.
Figure 6B:
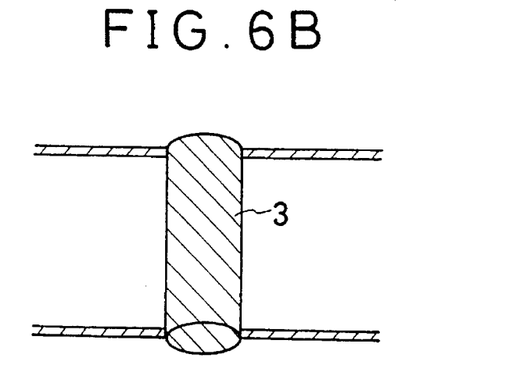

Next, as shown in FIGS. 6A and 6B, the hole 2 is filled with the copper paste 3 by using a filling device, etc.

Figure 7A:
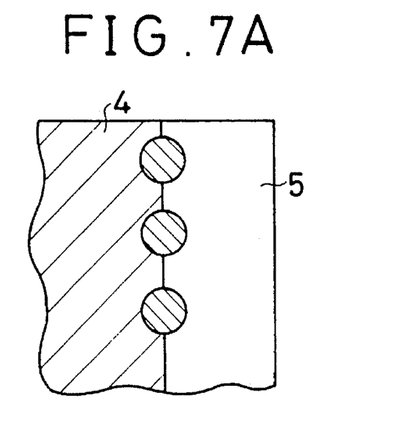
FIGS. 7A and 7B are diagrams of a portion of a printed circuit board used for explaining further the first embodiment of the method for manufacturing the printed circuit board according to the invention, FIG. 7A being a plan view thereof end FIG. 7B being a sectional view thereof.
Figure 7B:
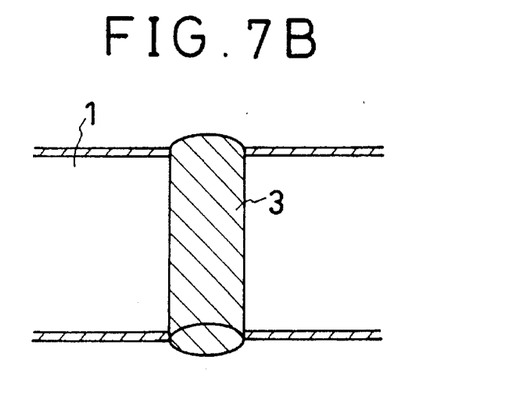

Then, as seen FIGS. 7A end 7B, by a method such as a tenting method using a dry film, the copper foil which exists on both surfaces of the copper plated laminate 1 of the substrate portion 5 that is removed at a later process step is removed at a position dividing the hole into two halves (i.e. the position where the metal resist 4 does not exist in FIG. 7A). In the other half of the hole (where the metal resist 4 exists in FIG. 7A), there remains the copper foil where circuits (circuit patterns) are formed. The portion of the copper foil that remains in place serves as the metal resist 4 for the etching of the substrate during the process step to follow.

Figure 8A:
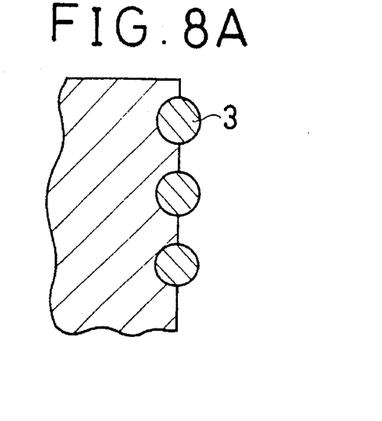
FIGS. 8A and 8B are diagrams of a portion of a printed circuit board used for explaining further the first embodiment of the method for manufacturing the printed circuit board according to the invention, FIG. 8A being a plan view thereof and FIG. 8B being a sectional view thereof.
Figure 8B:
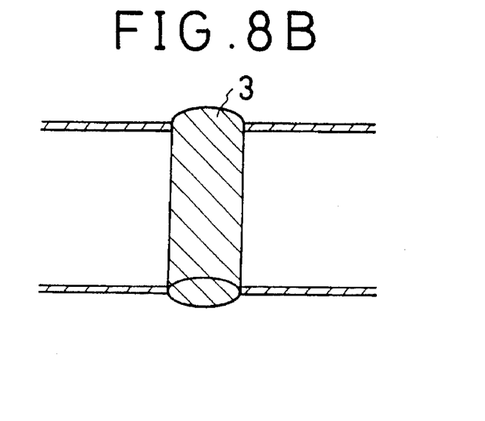

Then, as shown in FIGS. 8A end 8B, the substrate portion 5 that was exposed by the circuit formation step of the process is etched out. In this embodiment, where en epoxy material is used as the substrate material, the etching is carried out by repeating the dipping thereof into permanganic acid solution→hydrofluoric acid solution →permanganic acid solution whereby the substrate portion 5 exposed by the circuit formation step (FIG. 7A) is etched away. The permanganic acid solution used here dissolves the resin portion of the substrate material. The concentration of the permanganic acid solution differs depending on kinds of the materials, but in this embodiment it was set to 80 g/l and 10 minutes for each dip at 75° C. The hydrofluoric acid solution dissolves a glass cloth portion of the substrate material. The concentration thereof differs depending on the amount of the cloth, but in this embodiment it was set to 45 volume % and 5 minutes for each dip at 50° C.

Further, where a polyimide material is used as the substrate material, the substrate portion is dissolved by caustic soda and the glass cloth portion is dissolved by hydrofluoric acid solution.

Figure 9A:
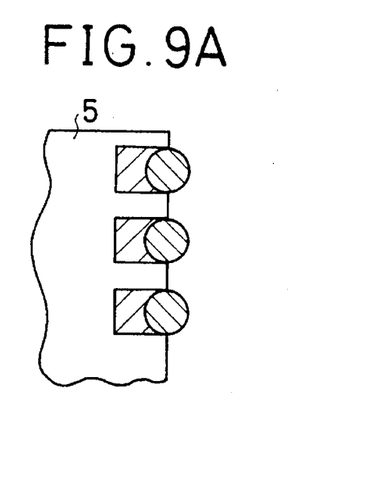
FIGS. 9A and 9B are diagrams of a portion of a printed circuit board used for explaining further the first embodiment of the method for manufacturing the printed circuit board according to the invention, FIG. 9A being a plan view thereof end FIG. 9B being a sectional view thereof.
Figure 9B:
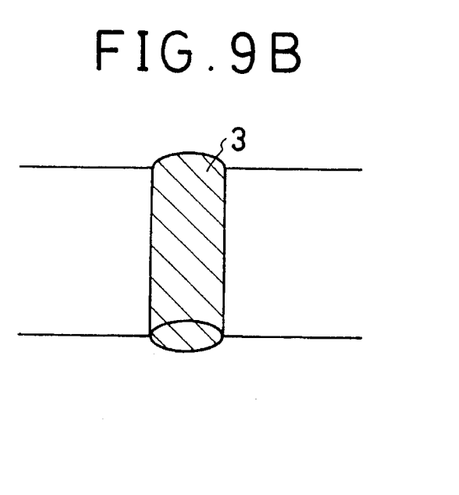

Then, as seen in FIGS. 9A and 9B, circuit patterns are formed using an electrostatic deposition (ED) process, etc.

whereby the printed circuit board according to the invention is obtained.

In the method according to this embodiment, no mechanical process is used for the formation of the end face through-hole, it is possible to obtain a printed circuit board which is free from the burrs to develop at side surfaces or from the conductive layer to be peeled off inside the through-hole.

FIGS. 10A and 10B–FIGS. 15A and 15B are diagrams used for explaining a second embodiment of the method for manufacturing a printed circuit board according to the invention, all of Figures A being plan views thereof and all of Figures B being sectional views thereof.

Figure 10A:
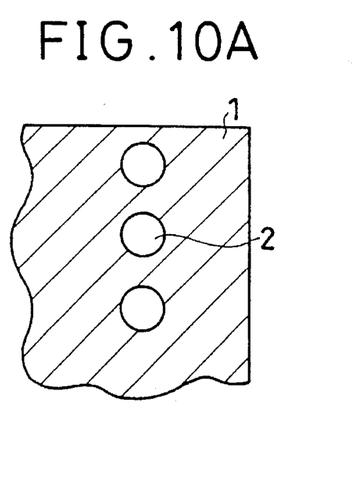
FIGS. 10A and 10B are diagrams of a portion of a printed circuit board used for explaining a second embodiment of a method for manufacturing the printed circuit board according to the invention, FIG. 10A being a plan view thereof and FIG. 10B being a sectional view thereof.
Figure 10B:
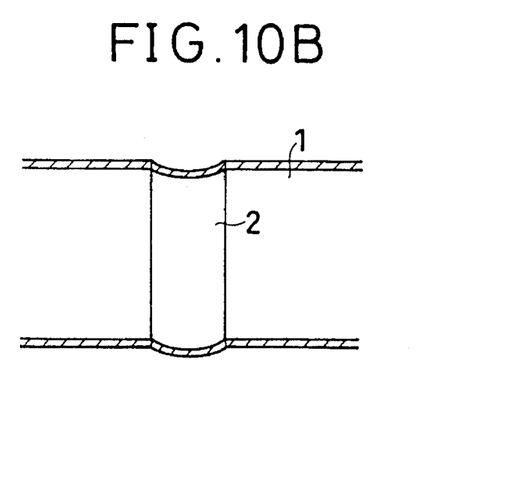

As shown in FIGS. 10A and 10B, a hole 2 is made at a predetermined location, by using a tool such as a drill, in a laminate 1 whose two surfaces are copper plated. The copper plated laminate 1 is not limited to being only of this form, and it may be a multi-layer laminate board. Also, the substrate material is not limited to any particular material as it may employ an epoxy material, a polyimide material, etc. In this embodiment, where the epoxy material is used, the thickness of the board is 0.8 mm and the diameter of the drill is 0.50 mm. However, there are no limitations to the substrate material, the thickness of the board end the diameter of the drill.

Figure 11A:
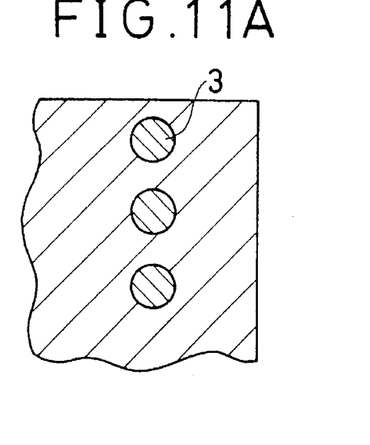
FIGS. 11A and 11B are diagrams of a portion of a printed circuit board used for explaining further the second embodiment of the method for manufacturing the printed circuit board according to the invention, FIG. 11A being a plan view thereof and FIG. 11B being a sectional view thereof.
Figure 11B:
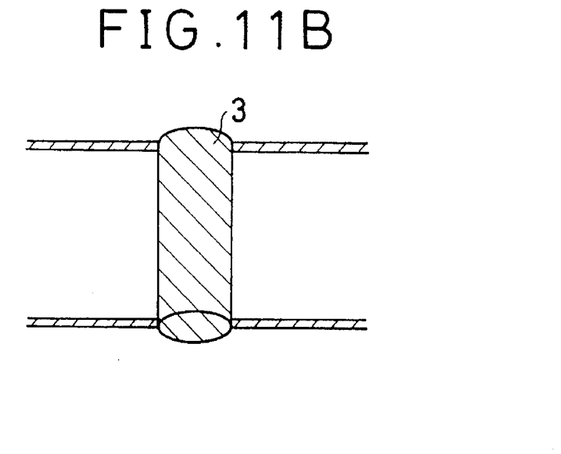

Next, as shown in FIGS. 11A and 11B, the hole 2 is filled with the copper paste 3 by using a filling device, etc.

Figure 12A:
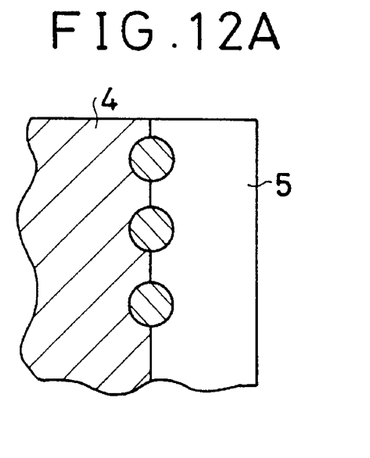
FIGS. 12A and 12B are diagrams of a portion of a printed circuit board used for explaining further the second embodiment of the method for manufacturing the printed circuit board according to the invention, FIG. 12A being a plan view thereof and FIG. 12B being a sectional view thereof.
Figure 12B:
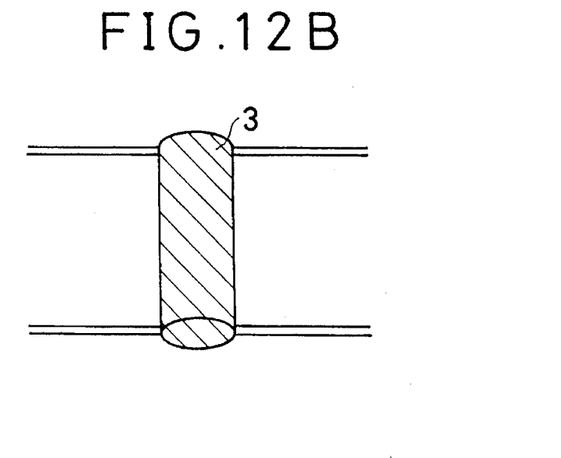

Then, as seen FIGS. 12A and 12B, by a method such as a tenting method using a dry film, the copper foil which exists on both surfaces of the copper plated laminate 1 of the substrate portion 5 that is removed at a later process step is removed at a position dividing the hole into two halves. The copper foil remaining is used for forming circuit patterns and used as the metal resist 4 for the etching of the substrate during the process step to follow.

Figure 13A:
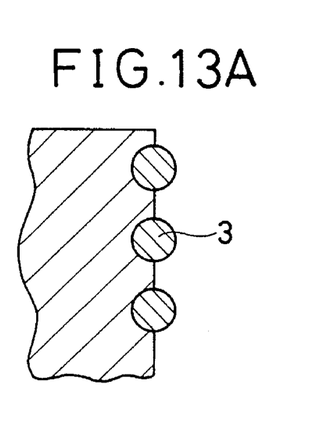
FIGS. 13A and 13B are diagrams of a portion of a printed circuit board used for explaining further the second embodiment of the method for manufacturing the printed circuit board according to the invention, FIG. 13A being a plan view thereof and FIG. 13B being a sectional view thereof.
Figure 13B:
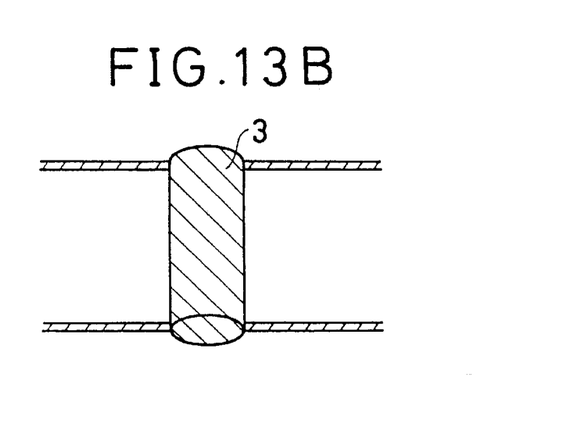

Then, as shown in FIGS. 13A and 13B, the substrate portion 5 that was exposed by the circuit formation step of the process is etched out. In this embodiment, since en epoxy material is used as the substrate material, the etching is carried out by repeating the dipping thereof into permanganic acid solution→hydrofluoric acid solution →permanganic acid solution whereby the substrate portion 5 exposed during the circuit formation step (FIG. 12A) is etched away. The permanganic acid solution used here dissolves the resin portion of the substrate material. The concentration of the permanganic acid solution differs depending on kinds of the materials, but in this embodiment it was set to 80 g/l and 10 minutes for each dip at 75° C. The hydrofluoric acid solution dissolves a glass cloth portion of the substrate material. The concentration thereof differs depending on the amount of the cloth, but in this embodiment it was set to 45 volume % and 5 minutes for each dip at 50° C. Further, where a polyimide material is used as the substrate material, the substrate portion is dissolved by caustic soda and the glass cloth portion is dissolved by hydrofluoric acid solution.

Figure 14A:
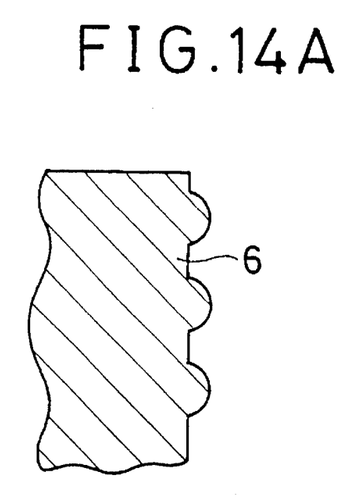
FIGS. 14A and 14B are diagrams of a portion of a printed circuit board used for explaining further the second embodiment of the method for manufacturing the printed circuit board according to the invention, FIG. 14A being a plan view thereof and FIG. 14B being a sectional view thereof.
Figure 14B:
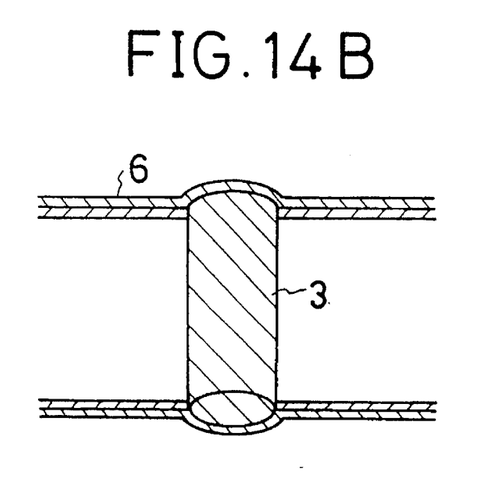

Then, as shown in FIGS. 14A and 14B, the thick electroplated copper layer is provided on the exposed surface. The thickness of the copper layer is not limited to any particular value, but in this embodiment the thickness was set to 20 μm.

Figure 15A:
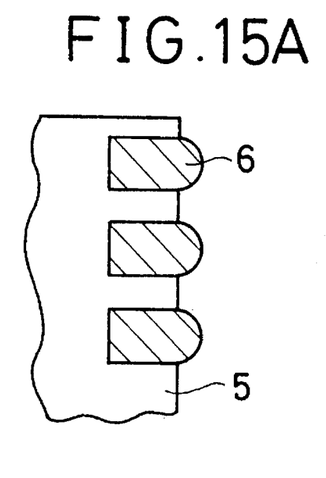
Figure 15B:
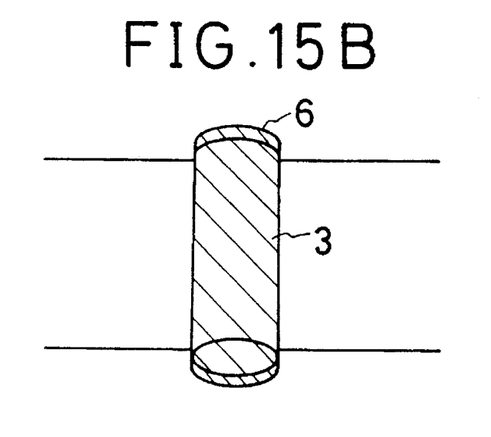

Next, as seen in FIGS. 15A and 15B, circuits are formed using an electrostatic deposition (ED) process, etc. whereby the printed circuit board according to the invention is obtained.

In this embodiment, the advantage is, in addition to the advantage achieved in the first embodiment, that the adhering property at the copper paste portion is enhanced because the copper foil portion and the copper paste portion are integrated by the copper layer.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for manufacturing a printed circuit board having an electrode on an end surface of a substrate, said method comprising the steps of:

forming a hole at a predetermined position of a laminate board whose two surfaces are copper plated;

filling in said hole with copper paste;

forming a circuit pattern such that a copper foil portion remains only in one half of said hole; and etching away an exposed region of said substrate.

2. The method for manufacturing a printed circuit board according to claim 1, in which said laminate board is a multi-layer laminate board.

3. The method for manufacturing a printed circuit board according to claim 1, in which said laminate board is made of epoxy material and said step of etching is carried out by repetition of dipping in permanganic acid solution and hydrofluoric acid solution.

4. The method for manufacturing a printed circuit board according to claim 1, in which said laminate board is made of polyimide material and said step of etching is carried out by repetition of dipping in caustic soda and hydrofluoric acid solution.

5. A method for manufacturing a printed circuit board having an electrode on an end surface of a substrate, said method comprising the steps of:

forming a hole at a predetermined position of a laminate board whose two surfaces are copper plated;

filling in said hole with copper paste;

forming a circuit pattern such that a copper foil portion remains only in one half of said hole;

etching away an exposed region of said substrate; and copper plating said copper foil portion and said copper paste portion for these portions to be integrated.

6. The method for manufacturing a printed circuit board according to claim 5, in which said laminate board is a multi-layer laminate board.

7. The method for manufacturing a printed circuit board according to claim 5, in which said laminate board is made of epoxy material and said step of etching is carried out by repetition of dipping in permanganic acid solution and hydrofluoric acid solution.

8. The method for manufacturing a printed circuit board according to claim 5, in which said laminate board is made of polyimide material and said step of etching is carried out by repetition of dipping in caustic soda and hydrofluoric acid solution.

\* \* \* \* \*

UNITED STATES PATENT AND TRADEMARK OFFICE
CERTIFICATE OF CORRECTION

PATENT NO. : 5,499,447
DATED : March 19, 1996
INVENTOR(S) : Tomoo Murakami

It is certified that error appears in the above-indentified patent and that said Letters Patent is hereby corrected as shown below:

Column 1, line 38, delete "8B" and insert --3B--.

Column 4, line 44, delete "end" and insert --and--.

Column 4, line 46, delete "en" and insert --an--.

Column 5, line 39, delete "en" and insert --an--.

Signed and Sealed this

Second Day of July, 1996

*Attest:*

BRUCE LEHMAN

*Attesting Officer*   Commissioner of Patents and Trademarks